US008981346B1

(12) United States Patent
Kamin et al.

(10) Patent No.: US 8,981,346 B1
(45) Date of Patent: Mar. 17, 2015

(54) CAPACITIVE-BASED GRAPHENE SENSOR

(71) Applicant: The United States of America as represented by the Secretary of the Navy, Washington, DC (US)

(72) Inventors: Nackieb Kamin, Kapolei, HI (US); Marcio De Andrade, San Diego, CA (US); David Garmire, Honolulu, HI (US); Richard Ordonez, Mililani, HI (US); Cody Hayashi, Waipahu, HI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/501,833

(22) Filed: Sep. 30, 2014

(51) Int. Cl.
*H01L 29/06* (2006.01)
*H01L 31/115* (2006.01)
*H01L 31/0336* (2006.01)
*H01L 27/144* (2006.01)

(52) U.S. Cl.
CPC .......... *H01L 31/115* (2013.01); *H01L 31/0336* (2013.01); *H01L 27/1443* (2013.01)
USPC ................................................ 257/29; 257/9

(58) Field of Classification Search
CPC ...................... H01L 29/1606; H01L 29/66015
USPC ....................................................... 257/9, 29
See application file for complete search history.

(56) References Cited

U.S. PATENT DOCUMENTS

| 7,781,061 | B2 * | 8/2010 | Garcia et al. | 428/402 |
|---|---|---|---|---|
| 8,013,286 | B2 * | 9/2011 | Ludwig | 250/214 A |
| 8,294,132 | B2 * | 10/2012 | Miao et al. | 257/3 |
| 8,324,555 | B2 * | 12/2012 | Ludwig | 250/214 A |
| 8,378,308 | B2 * | 2/2013 | Gerts et al. | 250/370.01 |
| RE44,469 | E * | 9/2013 | Ludwig | 250/214 A |
| 8,735,209 | B2 * | 5/2014 | Meric et al. | 438/82 |
| 2010/0021708 | A1 * | 1/2010 | Kong et al. | 428/220 |
| 2010/0173422 | A1 | 7/2010 | Koley et al. | |
| 2010/0218801 | A1 * | 9/2010 | Sung et al. | 136/244 |
| 2010/0255984 | A1 * | 10/2010 | Sutter et al. | 502/185 |
| 2012/0212242 | A1 * | 8/2012 | Masel et al. | 324/693 |
| 2013/0113081 | A1 * | 5/2013 | Chen et al. | 257/602 |
| 2013/0240830 | A1 * | 9/2013 | Seacrist et al. | 257/9 |
| 2014/0014905 | A1 * | 1/2014 | Lee et al. | 257/29 |
| 2014/0145148 | A1 * | 5/2014 | Lee | 257/29 |
| 2014/0225068 | A1 * | 8/2014 | Chung et al. | 257/29 |

(Continued)

OTHER PUBLICATIONS

Young, Andrea F., and Leonid S. Levitov. "Capacitance of graphene bilayer as a probe of layer-specific properties." Physical Review B 84.8 (2011): n. pag. Web. Jan. 26, 2012.
Hayashi, Cody, "Detector Capabilities of On-Chip Graphene", Student Thesis, University of Hawai'i at Manoa, available online at http://scholarspace.manoa.hawaii.edu/bitstream/handle/10125/32300/Hayashi_Cody_Honors_Thesis.pdf on Jan 15, 2014.

(Continued)

*Primary Examiner* — Earl Taylor
(74) *Attorney, Agent, or Firm* — SPAWAR Systems Center Pacific; Kyle Eppele; Ryan J. Friedl

(57) ABSTRACT

A system includes a semiconductor substrate having at least two electrodes disposed thereon, a dielectric layer disposed over the electrodes, a graphene layer disposed over the dielectric layer and electrically isolated from the electrodes, and a differential amplifier operatively connected to the electrodes and electrically isolated from the graphene layer. A radiation-sensitive layer may be disposed over the graphene layer and a voltage source may be operatively connected to two of the electrodes. The system may be contained on an integrated circuit and may be used to sense radiation in liquid and gas form.

16 Claims, 5 Drawing Sheets

(56) References Cited

U.S. PATENT DOCUMENTS

| | | | |
|---|---|---|---|
| 2014/0260547 A1* | 9/2014 | Balandin | 73/31.06 |
| 2014/0264255 A1* | 9/2014 | Elian et al. | 257/9 |
| 2014/0319655 A1* | 10/2014 | Sparta' et al. | 257/613 |
| 2014/0367824 A1* | 12/2014 | Kub et al. | 257/460 |

OTHER PUBLICATIONS

Robinson, Joshua A., et al., "Investigation of graphene-based nanoscale radiation sensitive materials", Proceedings of SPIE, Micro- and Nanotechnology Sensors, Systems, and Applications IV, vol. 8373, May 1, 2012.

* cited by examiner

CAPACITIVE-BASED GRAPHENE SENSOR

FEDERALLY SPONSORED RESEARCH AND DEVELOPMENT

The Capacitive-Based Graphene Sensor is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 102192.

BACKGROUND

Graphene is a popular material for use in sensing devices due to its zero bandgap nature and effective photon absorption qualities at low frequencies. Graphene sensors typically rely upon changes in resistivity as the main detection mechanism when graphene charge carriers interact with an external stimulus. However, resistive processes dissipate enough thermal energy to conceal the energy generated by electrons moving on the graphene layer. A need exists for an improved graphene-based sensing device that utilizes a non-resistive detection mechanism.

DETAILED DESCRIPTION OF SOME EMBODIMENTS

Figure 1:
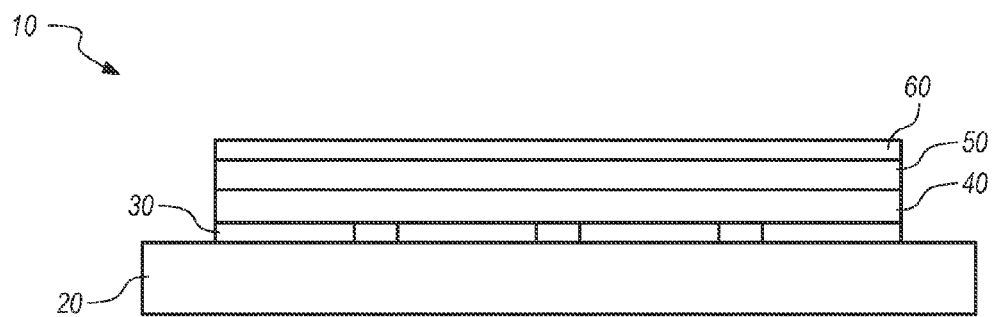
FIG. 1 shows a diagram illustrating a side view of an embodiment of a system in accordance with the Capacitive-Based Graphene Sensor.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The embodiments disclosed herein describe a system for detecting charged particles on a graphene surface. The linear energy dispersion and the ballistic properties of the two-dimensional structure of graphene allow for utilizing graphene for applications in nanoscale and atomic level charge particle detection. The term ballistic refers to the ability of charged particles to move in a certain length scale of the graphene sheet with extremely high conductivity due to the absence of scattering events. Ballistic properties can also be observed in carbon nanotubes, Si nanowires, and other materials. Ballistic behavior will not solely be responsible for the detection of energy associated with charge particles. The combination of ballistic properties and a gapless energy band within graphene's electronic structure is the necessary condition for detecting energy levels down to the single photon level.

Nevertheless, in some embodiments, the device proposed herein, may also detect energy levels much higher utilizing the same principle as long as the energy level to be detected is above the background energy. Some embodiments utilize capacitive probes that provide a low-contact, non-damaging alternative to the measurement of surface charge and surface potential characteristics. The embodiments disclosed herein allow for measurements of charge particles in either gases or liquids that have interacted with charge carriers within the graphene surface, or are within proximity of the surface, with high accuracy.

In another embodiment, a chemical coating can be applied to the graphene surface and the combination of the two substrates will add to the sensitivity of measuring gases that are sensitive to the chemical coating. The graphene layer can be biased by a variety of chemicals or gases that will make detection unique to a specific gas or liquid.

As an example, the embodiments disclosed herein may be used to improve chemical sensing technology. Generally, chemical sensors are defined by parameters such as selectivity, sensitivity, limit of detection, response time, and packaging. The disclosed embodiments help to provide for a more sensitive chemical sensor that is capable of multiple chemical agent detection rather than the current fine-tuned single chemical agent detection technology. Due to graphene's one atom thickness, detection circuitry may be located on the opposite side of graphene layer than is contacted by radiation. Further, effective junctions may be dynamically created in the graphene layer by electronically manipulating the underlying electric fields. As a result, graphene may be used as a sensing substrate in analyzing spatial ion concentrations in liquids and gases.

FIG. 1 shows a diagram illustrating a side view of an embodiment of a system 10 in accordance with the Capacitive-Based Graphene Sensor. System 10 includes a semiconductor substrate 20 having at least two electrodes 30 disposed thereon. Semiconductor substrate 20 may comprise various semiconductor materials known to those having ordinary skill in the art. For example, substrate 20 may comprise single element semiconductor materials such as silicon, class III-V semiconductors, class II-VI semiconductors, binary semiconductors, ternary semiconductors, and organic semiconductors. In some embodiments, electrodes 30 are disposed in parallel on the semiconductor substrate (see FIG. 4). In other embodiments, other configurations of electrodes 30 are possible depending, in part, upon the size of semiconductor substrate 20 and size and spacing of electrodes 20, as will be recognized by those having ordinary skill in the art.

A dielectric layer 40 is disposed over electrodes 30. As used herein, the term "disposed" means directly coupled to and contacting, such as by means of having been deposited or otherwise placed thereon. Dielectric material 40 may comprise any material that electrically insolates electrodes 30 from graphene layer 50, which is disposed over dielectric layer 40. The dielectric layer thickness can be varied to modify the capacitance of the device to provide better tunability and detection over a broader energy spectrum. As an example, dielectric layer 40 comprises polydimethylsiloxane (PDMS).

Graphene layer 50 is electrically isolated from electrodes 30. Graphene layer 50 comprises a layer of graphene. As used herein, "graphene" refers to a material that is more than 95% carbon by weight and includes at least one, one-atom-thick planar layer comprised of sp2-bonded carbon atoms that are densely packed in a honeycomb crystal lattice and held together by strong Van der Waals forces. The material may contain one layer of carbon atoms or a plurality of layers of carbon atoms. In some embodiments, graphene layer 50 is a graphene bi-layer. In some embodiments, graphene layer 50 comprises multiple layers of graphene. Multiple layers of graphene may allow for a more precise determination of the energy levels of the incident radiation.

Figure 3A:
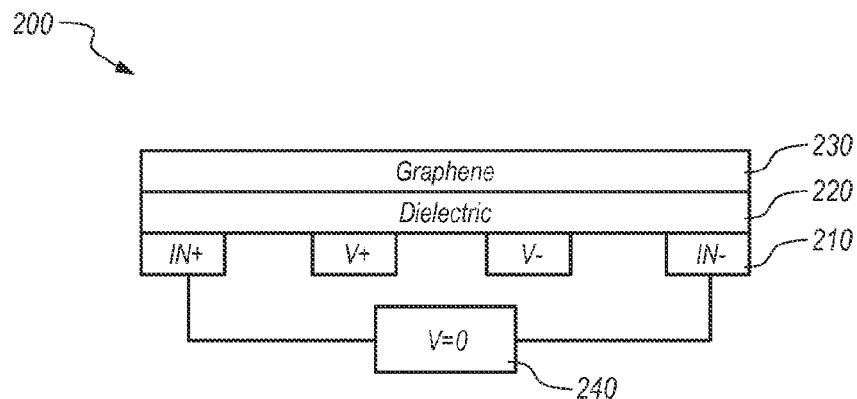
FIGS. 3A-3C show diagrams illustrating the operation of a capacitive-based graphene sensor to detect radiation.
Figure 3B:
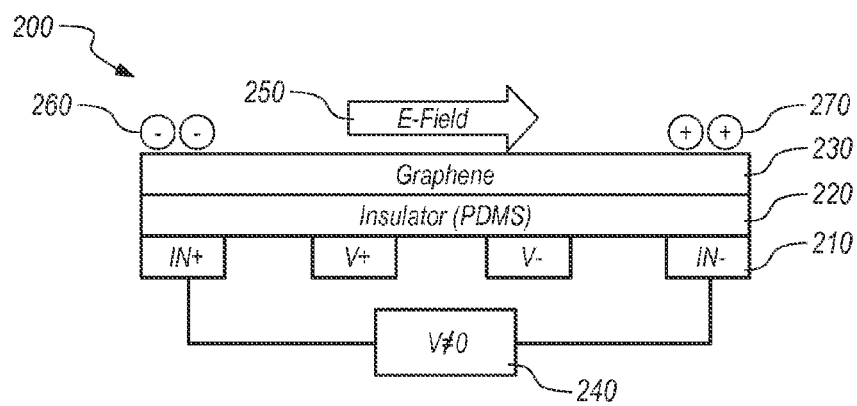
Figure 3C:
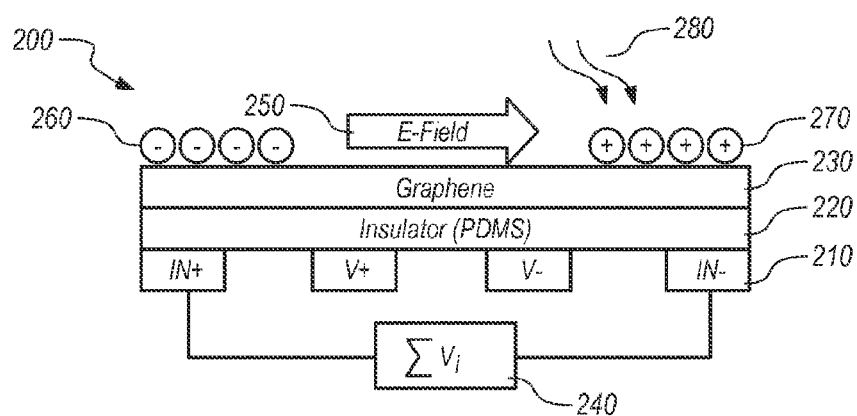

A radiation-sensitive layer 60 is disposed over graphene layer 50. Examples of radiation-sensitive material that may be used for radiation-sensitive layer 60 include hexagonal boron nitride (hBN) and graphene oxide. As an example, radiation-sensitive layer 60 may be spray deposited on graphene layer 50. Radiation-sensitive layer 60 helps to capture incident radiation that interacts with graphene layer 50 to cause graphene layer 50 to generate charge carriers. The term charge carrier refers to free particles that carry an electric charge, and thus may refer to an electron, a hole, or both electrons and holes. Radiation-sensitive layer 60 may be tailored to allow for the capture of particular radiation, such as alpha particles, beta particles, protons, electrons, and/or neutrons. The effect caused by interaction of graphene layer 50 and incident radiation is shown in FIGS. 3B and 3C.

Figure 2:
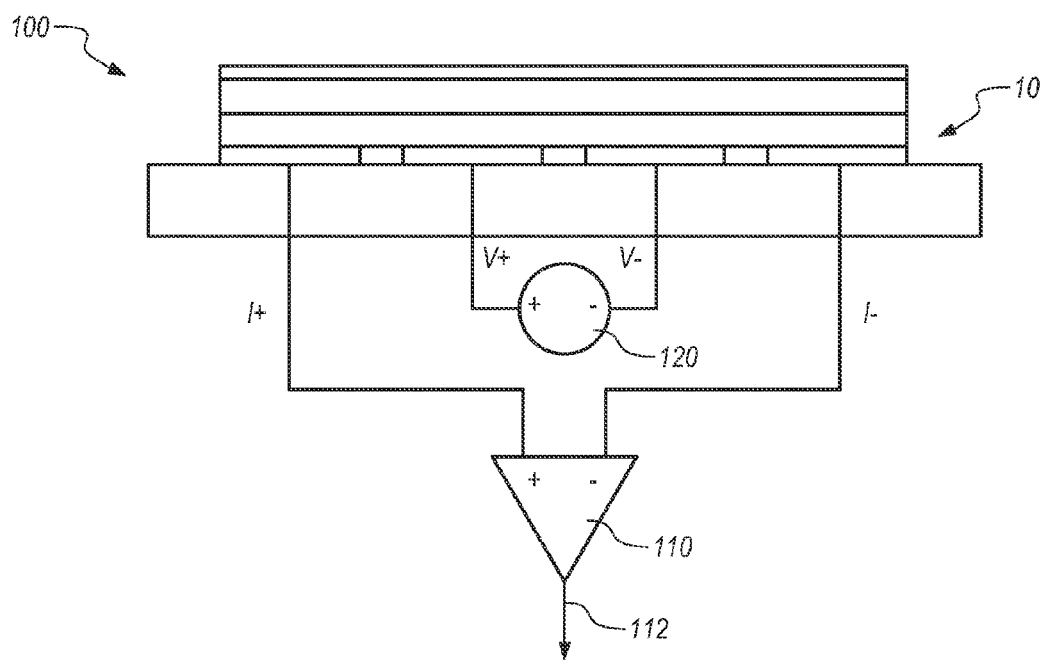
FIG. 2 shows a diagram illustrating a side view of an embodiment of another system in accordance with the Capacitive-Based Graphene Sensor.

Referring to FIG. 2, FIG. 2 shows a diagram illustrating a side view of an embodiment of a system 100 in accordance with the Capacitive-Based Graphene Sensor. System 100 includes system 10 shown in FIG. 1 as well as a differential amplifier 110 that is operatively connected to electrodes 30 and is electrically isolated from graphene layer 50. In some embodiments, differential amplifier 110 is a Complementary metal-oxide-semiconductor (CMOS) differential amplifier. In some embodiments, the differential amplifier is contained within CMOS architecture that contains differential amplifiers and analog-to-digital conversion. In some embodiments, differential amplifier 110 is a fully-differential amplifier, which provides a low-noise, sensitive solution for the measurement of small differential signals. The output 112 of differential amplifier 110 may be sent other circuitry (not shown) for further amplification or other processing depending upon the particular application and system configuration, or to an on-chip or off-chip storage device.

System 100 further may include a voltage source 120 operatively connected to electrodes 30. Voltage source 120 may be used to apply an electric field stimulus that will move and separate charges across the graphene surface due the interaction of radiation with graphene layer 50, as is shown in FIGS. 3A-3C. As shown voltage source 120 is configured to be facing graphene layer 50 from underneath. In some embodiments, graphene layer 50 may be scanned across voltage source 120 using a MEMS suspension. In some embodiments, system 100 may contain several sets of differential amplifiers 110 and voltage sources 120 in parallel to reduce the travel distance across graphene layer 50 when scanning the entirety of graphene layer 50.

In some embodiments, voltage source 120 comprise of a pair of voltage electrodes positioned so the distance between them tunes the energy detection. For example, in one embodiment, the distances can be optimized so not to exceed the distance travelled by the charge carriers without scattering for optimum energy detection. In another embodiment, the distance between the voltage electrodes can be larger, and even in the presence of scattering by the charge carriers, the charge carriers will still have energy above the background energy so to be able to be identified. The distance between voltage electrodes may also be optimized to increase the number of incident particles within the area between the two sources. In this case, due to the large number of incident particles the total energy will still be larger than the background energy even in the presence of scattering.

Referring to FIGS. 3A-3C, such figures show diagrams illustrating the operation of a capacitive-based graphene sensor system 200 to detect radiation. System 200 may be configured similarly to system 100 shown in FIG. 2. The components of system 200 may be configured similarly to like components of system 10 shown in FIG. 1 and system 100 shown in FIG. 2. System 200 includes electrodes 210 disposed on a substrate (not shown), a dielectric layer 220 disposed on electrodes 210, a graphene layer 230 disposed on dielectric layer 220, a voltage probe 240 operatively connected to electrodes 210, specifically the inner electrodes, and a differential amplifier (not shown).

In FIG. 3A, the differential amplifier is set to "ON"; however, since no voltage is applied to inner electrodes 210 by a voltage source (not shown), no voltage difference is measured across the outer electrodes 210. In FIG. 3B, the differential amplifier is set to "ON" and a voltage is applied to the inner electrodes 210. As a result, an electric field 250 is generated across graphene layer 230, with negative charges 260 freely accumulating on the left side of the graphene layer 230 and positive charges 270 freely accumulating on the right side of graphene layer 230. Voltage probe 240 detects a voltage difference across the graphene surface as charge carriers 260, 270 accumulate over the graphene layer surface 230.

In FIG. 3C, the differential amplifier is set to "ON" and a voltage is applied to electrodes 210, generating electric field 250, negative charges 260, and positive charges 270. Radiation 280 interacts with negative charges 260 and positive charges 270, causing the voltage measured by voltage probe 240 to fluctuate. For example, as a charged chemical ion settles on the graphene surface, the induced electric field effectively excites additional charge carriers that can be detected and amplified by underlying circuitry.

Figure 4:
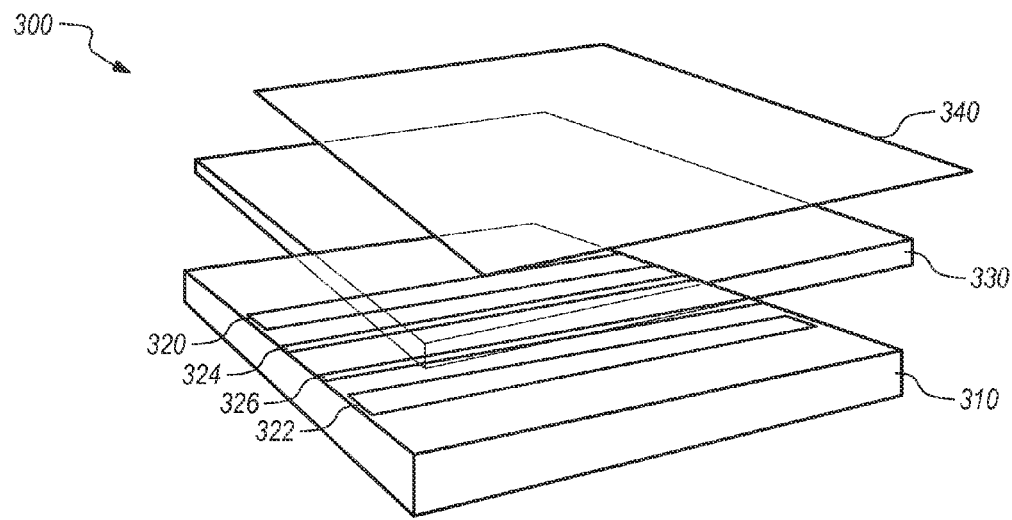
FIG. 4 shows a diagram illustrating an exploded view of an embodiment of a system in accordance with the Capacitive-Based Graphene Sensor.

FIG. 4 shows a diagram illustrating an exploded view of an embodiment of a system 300 in accordance with the Capacitive-Based Graphene Sensor. System 300 includes a semiconductor substrate 310 having at least two electrodes 320, 322, 324, and 326, disposed thereon. As shown, electrodes 320, 322, 324, and 326 are disposed in parallel on substrate 310, however other configurations are possible. As an example, electrodes 320, 322, 324, and 326 may comprise a metallic material that may be readily deposited on substrate 310.

Although four electrodes or "rails" are shown in FIG. 4, those having ordinary skill in the art will realize that more or less electrodes may be disposed on substrate 310 depending on the particular design employed. Additionally, while electrodes 320, 322, 324, and 326 are equally spaced apart, in other embodiments they may have spacing that varies from one another. As the distance between the electrodes increases, a smaller electric field is expected to be detected. As an example, electrode 320 may serve as the differential amplifier input, IN+, electrode 322 may serve as the differential amplifier input, IN−, electrode 324 may serve as the positive voltage electrode, V+, and electrode 326 may serve as the negative voltage electrode, V−. A dielectric layer 330 is disposed over electrodes 320, 322, 324, and 326. A graphene layer 340 is disposed over dielectric layer 330 and is electrically isolated from electrodes 320, 322, 324, and 326.

Figure 5:
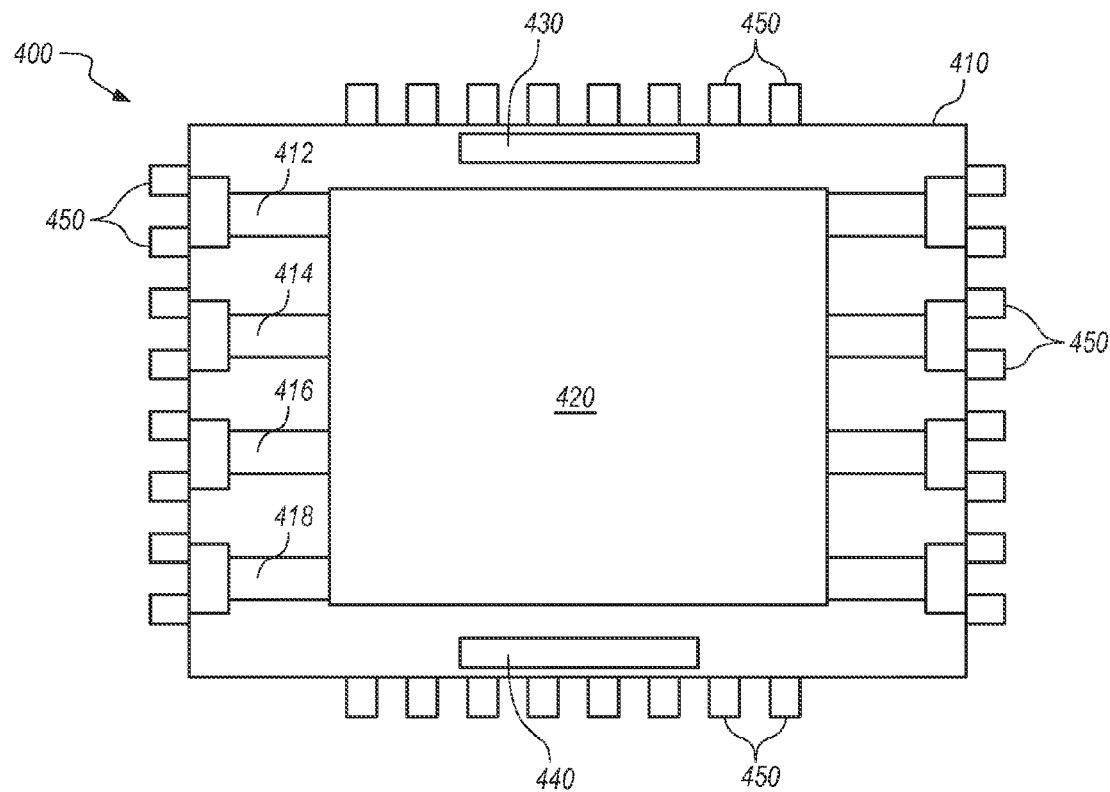
FIG. 5 shows a diagram illustrating a top view of an embodiment of a system in accordance with the Capacitive-Based Graphene Sensor.

FIG. 5 shows a diagram illustrating a top view of an embodiment of a system 400 in accordance with the Capacitive-Based Graphene Sensor. As an example, system 400 may comprise a portion of an integrated circuit (IC). System 400 includes a substrate 410 having electrodes 412, 414, 416, and 418 disposed thereon. A graphene layer 420 is disposed on electrodes 412, 414, 416, and 418. Differential amplifiers 430 and 440 are operatively connected to one or more of electrodes 412, 414, 416, and 418 via wired connections (not shown) such as is standard in the art. Pads 450 surround substrate 410 and provide connections for other components of the integrated circuit. Electrodes 412, 414, 416, and 418 may be connected to one or more of pads 450 via standard connection means.

Figure 6:
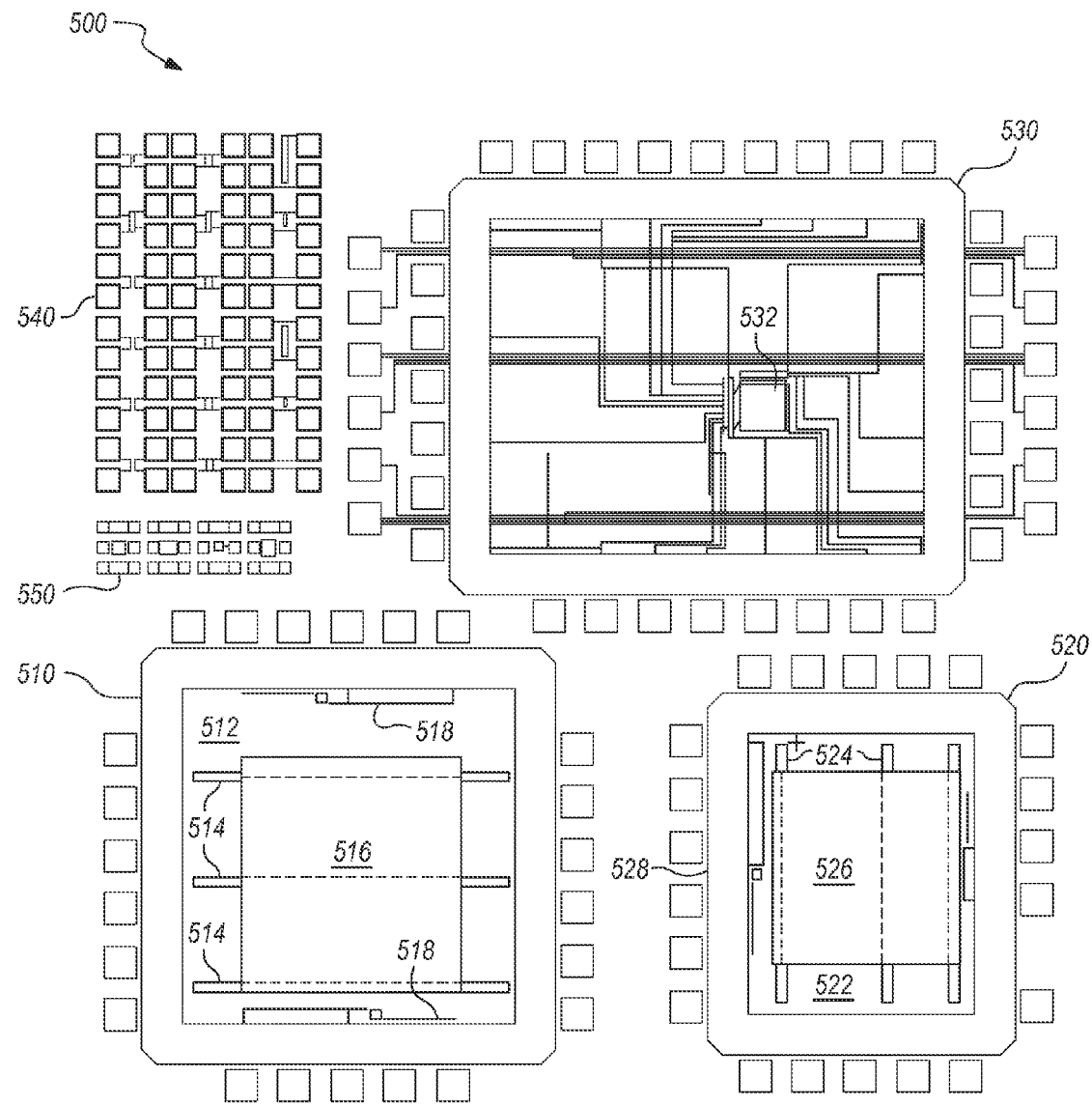
FIG. 6 shows a diagram illustrating a top view of an integrated circuit containing a system in accordance with the Capacitive-Based Graphene Sensor.

FIG. 6 shows a diagram illustrating a top view of an IC 500 containing a system in accordance with the Capacitive-Based Graphene Sensor. As an example, the size of IC 500 may be 5 mm×5 mm. IC 500 includes graphene portions 510 and 520, memory portion 530, and logic portions 540 and 550. Graphene portions 510 and 520 may be configured to include some or all of the components of systems 10, 100, 200, 300, and 400 described herein.

Particularly, portion 510 may include a substrate 512, electrodes 514 disposed thereon, a dielectric and graphene layer 516 disposed on electrodes 514, and differential amplifiers 518 operatively connected to electrodes 514 and electrically isolated from the graphene layer. Similarly, portion 520 may include a substrate 522, electrodes 524 disposed thereon, a dielectric and graphene layer 526 disposed on electrodes 524, and differential amplifiers 528 operatively connected to electrodes 524 and electrically isolated from the graphene layer. As an example, electrodes 514 and 524 may be 80 um wide and may be spaced apart by 0.85 um.

Memory portion 530 includes a memory circuit 532, which may comprise volatile or non-volatile memory. As an example, memory circuitry 532 may comprise RAM, DRAM, SRAM, or any other type of volatile memory known to those having ordinary skill in the art. Logic portions 540 and 550 may perform all logic calculations necessary for the various different portions of IC 500. As an example, logic portion 540 may comprise NMOS (n-channel MOSFET) logic circuitry and logic portion 550 may comprise PMOS (p-channel MOSFET) logic circuitry.

Figure 7:
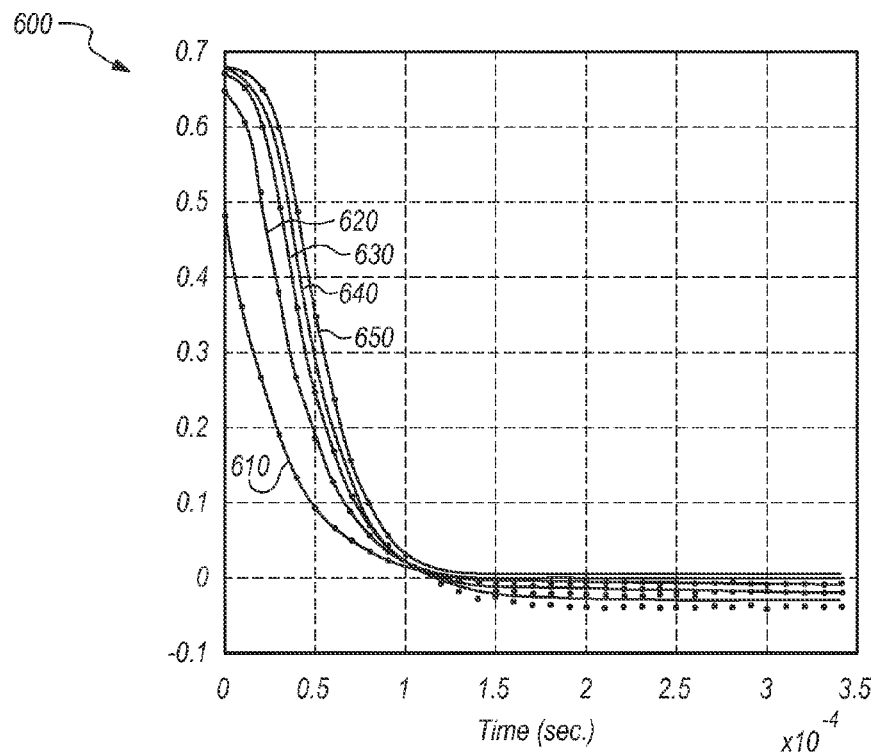
FIGS. 7 and 8 show graphs illustrating the voltage output response of a differential amplifier in a capacitive-based graphene sensor system as the electric field bias voltage varies.
Figure 8:
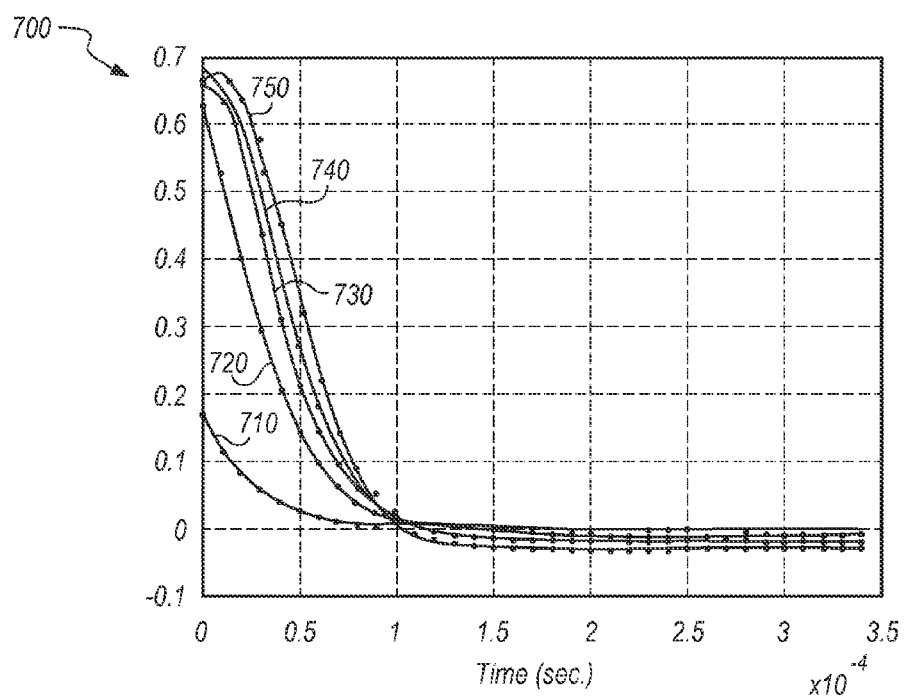

FIGS. 7 and 8 show graphs illustrating the voltage output response of a differential amplifier in a capacitive-based graphene sensor system as the electric field bias voltage varies. FIG. 7 shows a graph 600 illustrating the voltage output response for even numbered voltage levels from zero to ten. Particularly, line 610 shows the output response for a bias voltage of 2V, line 620 shows the output response for a bias voltage of 4V, line 630 shows the output response for a bias voltage of 6V, line 640 shows the output response for a bias voltage of 8V, and line 650 shows the output response for a bias voltage of 10V.

FIG. 8 shows a graph 700 illustrating the voltage output response for odd numbered voltage levels from zero to ten. Particularly, line 710 shows the output response for a bias voltage of 1V, line 720 shows the output response for a bias voltage of 3V, line 730 shows the output response for a bias voltage of 5V, line 740 shows the output response for a bias voltage of 7V, and line 750 shows the output response for a bias voltage of 9V. Graphs 700 and 800 illustrate lines showing an exponential fit that represents a capacitor like discharge according to the equation $V=V_o e^{-t/Rc}$.

Many modifications and variations of the Capacitive-Based Graphene Sensor are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A system comprising:
 a semiconductor substrate having at least two electrodes disposed thereon;
 a dielectric layer disposed over the electrodes;
 a graphene layer disposed over the dielectric layer and electrically isolated from the electrodes; and
 a differential amplifier operatively connected to the electrodes and electrically isolated from the graphene layer.

2. The system of claim 1, wherein the differential amplifier is a complementary metal oxide semiconductor (CMOS) differential amplifier.

3. The system of claim 1, wherein the dielectric layer comprises polydimethylsiloxane.

4. The system of claim 1, wherein the electrodes are oriented in parallel on the semiconductor substrate.

5. The system of claim 1, wherein the semiconductor substrate comprises silicon.

6. The system of claim 1 further comprising a radiation-sensitive layer disposed over the graphene layer.

7. The system of claim 6, wherein the radiation-sensitive layer comprises hexagonal boron nitride.

8. The system of claim 1, wherein the semiconductor substrate is contained on an integrated circuit.

9. The system of claim 1 further comprising at least one voltage source operatively connected to two of the electrodes.

10. A system comprising:
 a semiconductor substrate having at least two electrodes oriented in parallel thereon;
 a dielectric layer disposed over the electrodes;
 a graphene layer disposed over the dielectric layer and electrically isolated from the electrodes;
 a radiation-sensitive layer disposed over the graphene layer; and a differential amplifier operatively connected to the electrodes and electrically isolated from the graphene layer.

11. The system of claim 10, wherein the differential amplifier is a complementary metal oxide semiconductor (CMOS) differential amplifier.

12. The system of claim 10, wherein the dielectric layer comprises polydimethylsiloxane.

13. The system of claim 10, wherein the semiconductor substrate comprises silicon.

14. The system of claim 10, wherein the radiation-sensitive layer comprises hexagonal boron nitride.

15. The system of claim 10, wherein the semiconductor substrate is contained on an integrated circuit.

16. The system of claim 10 further comprising at least one voltage source operatively connected to two of the electrodes.

* * * * *